US010312923B2

(12) United States Patent
Ek et al.

(10) Patent No.: US 10,312,923 B2
(45) Date of Patent: Jun. 4, 2019

(54) ELECTRONIC CIRCUIT, PHASE-LOCKED LOOP, TRANSCEIVER CIRCUIT, RADIO STATION AND METHOD OF FREQUENCY DIVIDING

(71) Applicant: Telefonaktiebolaget LM Ericsson (publ), Stockholm (SE)

(72) Inventors: Staffan Ek, Malmö (SE); Tony Påhlsson, Lund (SE); Henrik Sjöland, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/113,332

(22) Filed: Aug. 27, 2018

(65) Prior Publication Data

US 2018/0367153 A1 Dec. 20, 2018

Related U.S. Application Data

(63) Continuation of application No. 15/577,930, filed as application No. PCT/EP2015/063497 on Jun. 16, 2015, now Pat. No. 10,110,238.

(51) Int. Cl.
*H03L 7/197* (2006.01)
*H03L 7/099* (2006.01)
(Continued)

(52) U.S. Cl.
CPC ............ *H03L 7/0996* (2013.01); *H03L 7/191* (2013.01); *H03L 7/1974* (2013.01); *H03K 23/667* (2013.01); *H03K 23/68* (2013.01)

(58) Field of Classification Search
CPC ....... H03K 21/00; H03L 7/1974; H03B 27/00
(Continued)

(56) References Cited

U.S. PATENT DOCUMENTS 3,876,867 A 4/1975 Schull et al.
6,542,013 B1 4/2003 Volk et al.
(Continued)

FOREIGN PATENT DOCUMENTS

RU 2058667 C1 4/1996
SU 1259482 A1 9/1986

OTHER PUBLICATIONS

Axholt, A, et al., "A 60 GHz Receiver Front-End with PLL based Phase Controlled LO Generation for Phased-Arrays", IEEE Proc. Asia Pacific Microwave Conference, APMC 2011, Melbourne, Australia, Dec. 2011, pp. 119-124.
(Continued)

*Primary Examiner* — Kevin Kim
(74) *Attorney, Agent, or Firm* — Murphy, Bilak & Homiller, PLLC

(57) ABSTRACT

Exemplary embodiments include an electronic frequency-divider circuit comprising a multi-phase generator circuit configured to: receive an oscillating input signal having a frequency f; determine an integer divide ratio Q based on a first control signal input; and based on the oscillating input signal, generate an N-phase output signal having a frequency f-divided-by-M, wherein M is an integer and adjacent phases of the N-phase output signal are separated by 360-divided-by-(M-times-Q) degrees. The divider circuit can also include a control circuit configured to receive a control input and, based on the control input: provide the first control signal to the multi-phase generator circuit; and select a particular phase of the N-phase output signal. Exemplary embodiments also include a phase-locked loop circuits, transceiver circuits, radio stations, and methods of frequency-dividing an oscillating signal.

20 Claims, 6 Drawing Sheets

(51) Int. Cl.
*H03L 7/191* (2006.01)
*H03K 23/66* (2006.01)
*H03K 23/68* (2006.01)

(58) Field of Classification Search
USPC .................................................. 327/115, 117
See application file for complete search history.

(56) References Cited

U.S. PATENT DOCUMENTS

| | | | |
|---|---|---|---|
| 7,323,913 B1 | 1/2008 | Kossel | |
| 8,513,987 B1 | 8/2013 | Kim et al. | |
| 2004/0036513 A1 | 2/2004 | Gibbons et al. | |
| 2007/0041486 A1 | 2/2007 | Shin et al. | |
| 2008/0297269 A1* | 12/2008 | Lin | H04L 27/12 332/100 |
| 2010/0164562 A1 | 7/2010 | Tseng et al. | |
| 2011/0241747 A1* | 10/2011 | Prathapan | G06F 1/06 327/291 |
| 2012/0056644 A1 | 3/2012 | Kondou | |
| 2014/0185391 A1* | 7/2014 | Tokuhiro | G06F 13/1689 365/189.07 |
| 2017/0219643 A1* | 8/2017 | Kim | G01R 31/31709 |
| 2018/0287558 A1* | 10/2018 | Li | H03B 27/00 |

OTHER PUBLICATIONS

Axholt, A, et al., "A PLL based 12GHz LO Generator with Digital Phase Control in 90nm CMOS", Analog Integrated Circuits and Signal Processing, vol. 67, Issue No. 3, 2011, pp. 309-318.

Floyd, Brian A., "Sub-Integer Frequency Synthesis Using Phase-Rotating Frequency Dividers", IEEE Transactions on Circuits and Systems—1:Regular Papers, vol. 55, No. 7, Aug. 2008, pp. 1823-1833.

Shu, Keliu, et al., "A 24 GHz Monolithic Factional-N Frequency Synthesizer with Robust Phase-Switching Prescaler and Loop Capacitance Multiplier", IEEE Journal of Solid-State Circuits, vol. 38, No. 6, Jun. 2003, pp. 866-874.

Heng, Chun-Huat, "A 1.8-GHz CMOS Fractional-N Frequency Synthesizer with Randomized Multiphase VCO", IEEE Journal of Solid-State Circuits, vol. 38, No. 6, Jun. 2003, pp. 848-854.

* cited by examiner

ELECTRONIC CIRCUIT, PHASE-LOCKED LOOP, TRANSCEIVER CIRCUIT, RADIO STATION AND METHOD OF FREQUENCY DIVIDING

RELATED APPLICATIONS

The present Application is a continuation of, and claims priority to, application Ser. No. 15/577,930 filed 29 Nov. 2017, the entirety of which is incorporated herein by reference for all purposes.

TECHNICAL FIELD

The present invention generally relates to an electronic circuit arranged to receive an oscillating signal and output an output signal at a frequency having a frequency relation with the oscillating signal defined by a divide ratio, and a phase-locked loop circuit, a transceiver circuit, and a radio station comprising such an electronic circuit, and a method of frequency dividing.

BACKGROUND

As radio circuits become more complex and also are designed to work at still higher frequencies, the elements tend to consume more power. Frequency dividers are important elements of radio circuits, and are for example used for synthesizing signals of desired frequency and phase. For example, multi-band radio circuits rely on the ability to generate signals at different controllable frequencies. Another example is application of beamforming where a plurality of antennas is fed by signals with a controlled phase such that the arrangement of the plurality of antennas provides a desired directional characteristic.

It is foreseen that cellular systems may use millimeter waves. The frequencies may in such cases range from about 15 to 60 GHz. In order to use the system outdoors, a longer cyclic prefix may be used compared with 60 GHz indoor systems. For this, a closer sub-carrier spacing in the OFDM modulation may be advantageous, however posing stringent phase noise requirements. At the same time beamforming is advantageously supported to increase the range and capacity of the system. A large number of antenna elements are then used. The signal at each element will have an individual phase shift which controls the beam direction. One key implementation alternative is to impose phase shifts in the local oscillator signal. The local oscillator frequency is in such cases preferably made programmable to be able to operate on different channels and in different bands.

An implementation of the local oscillator generation circuitry beneficially strives towards achieving low phase noise, individually programmable phase, programmable frequency, and/or distributing the signals to all transceivers in a beamforming system, all without consuming excessive power.

It is therefore a desire to provide an approach for an electronic circuit providing one or more of the above mentioned desired features at a moderate power consumption.

SUMMARY

According to a first aspect, there is provided an electronic circuit arranged to receive an oscillating signal and output an output signal at a frequency having a frequency relation with the oscillating signal defined by a divide ratio. The electronic circuit comprises a first frequency divider arranged to receive the oscillating signal and output N frequency divided signals of different phases, a second frequency divider arranged to receive one of the N signals and frequency divide the received signal by a value given by a first control signal provided to the second frequency divider, N latch circuits each being arranged to receive a respective one of the N signals at a clocking input of the respective latch circuit and to receive an output of the second frequency divider at an input of the respective latch circuit, a multiplexer circuit arranged to receive outputs of the N latch circuits and to output a signal, on which the output signal is based, selected from the received signals based on a second control signal provided to the multiplexer circuit, and a control circuit arranged to provide the first control signal and the second control signal based on the divide ratio.

The signal output from the multiplexer circuit may be the output signal of the electronic circuit.

The electronic circuit may comprise an output latch circuit arranged to receive the oscillating signal at a clocking input of the output latch circuit, receive the signal output from the multiplexer circuit at an input of the output latch circuit, and output the output signal of the electronic circuit.

The control circuit may be a state machine arranged to provide the first and the second control signals for each cycle of the output signal of the electronic circuit based on the divide ratio and a selected phase by the multiplexer circuit for a preceding cycle of the output signal. The control circuit may comprise an integer divider circuit arranged to divide the divide ratio by M and provide an integer quotient value and an integer remainder value, a modulo-M-counter arranged to receive the remainder value as an input and the output signal as a clocking input, and to output a count value and a carry value, and an adder circuit arranged to add the quotient value and the carry value to form the first control signal, wherein the second control signal is based on the count value. The control circuit may comprise a latch circuit arranged to receive the count value as an input and one of the outputs of the N latch circuits as a clocking signal, wherein the output from the latch circuit is the second control signal.

According to a second aspect, there is provided a phase-locked loop circuit comprising a frequency divider comprising the electronic circuit of the first aspect.

According to a third aspect, there is provided a transceiver circuit comprising the phase-locked loop circuit of the second aspect.

According to a fourth aspect, there is provided a radio station comprising the transceiver circuit of the third aspect, and an antenna arrangement connected to the transceiver circuit.

According to a fifth aspect, there is provided a method of frequency dividing an oscillating signal. The method comprises forming M signals of different phases by a first frequency divider from the oscillating signal, wherein each of the M signals has a frequency of 1/M of the oscillating signal, frequency dividing one of the M signals by a second frequency divider with a value given by a first control signal provided to the second frequency divider, clocking M latch circuits with a respective one of the M signals to provide respective latched output signal of an output of the second frequency divider, selecting, based on a second control signal, from the latched output signals a signal, on which an output signal of the frequency dividing is based, providing the first control signal and the second control signal based on a divide ratio, and outputting the output signal at a frequency having a frequency relation with the oscillating signal defined by the divide ratio.

The selected latched output signal may be the output signal.

The method may comprise clocking an output latch circuit with the oscillating signal to provide the output signal from the selected latched output signal.

The providing of the first and the second control signals may be performed for each cycle of the output signal by a state machine based on the divide ratio and the selection of the signal for a preceding cycle of the output signal. The providing of the first and the second control signals may comprise dividing the divide ratio by M by an integer divider to provide an integer quotient value and an integer remainder value, modulo-M-counting the remainder value using the output signal as a clocking to provide a count value and a carry value, and adding the quotient value and the carry value to form the first control signal, wherein the second control signal is based on the count value. The second control signal may be formed as a latched value of the count value clocked by the output signal.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Figure 1:
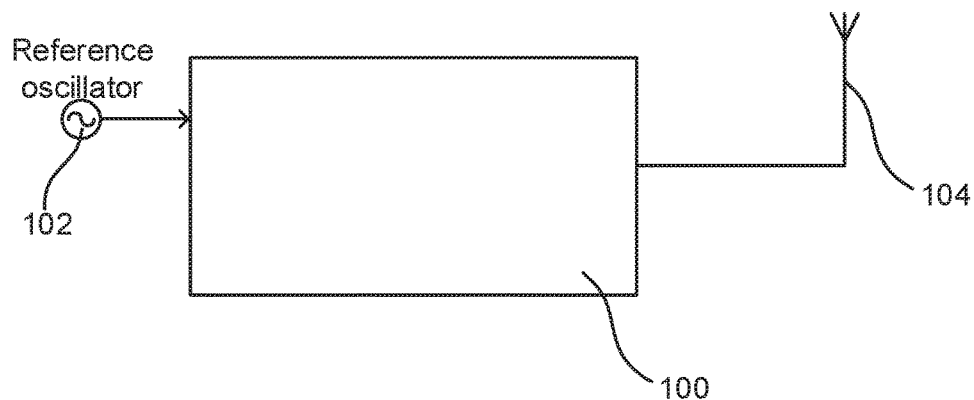
FIG. 1 illustrates a receiver, transmitter or transceiver which is provided a reference signal at an accurately defined frequency from a reference oscillator to be able to transmit/receive signals at a desired frequency by an antenna.

FIG. 1 very schematically illustrates a receiver, transmitter or transceiver 100 which is provided by a reference signal at an accurately defined frequency from a reference oscillator 102 to be able to transmit/receive signals at a desired frequency by an antenna 104. The reference oscillator 102 normally provides a fixed frequency. To enable sending/transmitting at the desired frequency, a frequency is synthesized based on the reference signal. For this, a phase-locked loop (PLL) may be used. For the more complex tasks of a receiver/transmitter/transceiver, e.g. beamforming as discussed in the background section, it is not only the frequency of a signal that is desired; it is also its correct phase.

Figure 2:
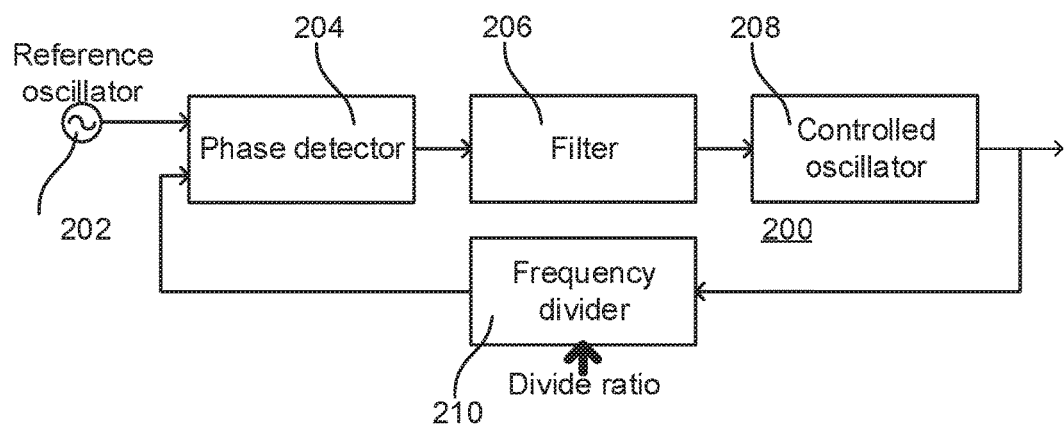
FIG. 2 schematically illustrates a phase-locked loop.
Figure 3:
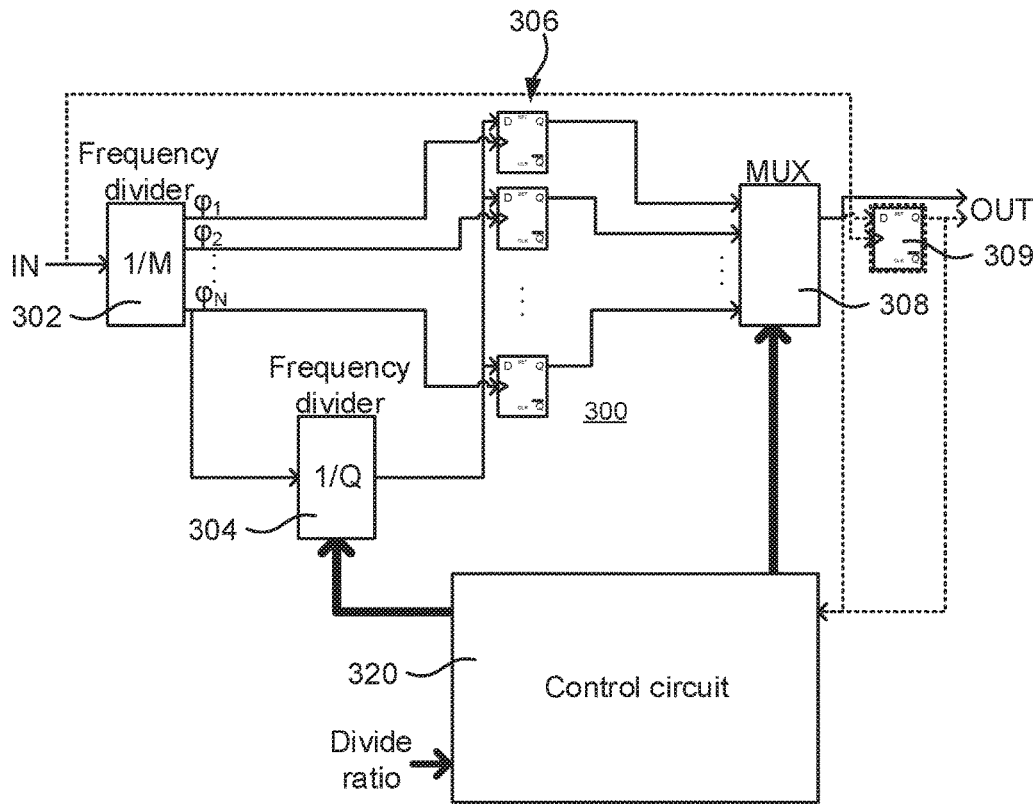
FIG. 3 schematically illustrates a frequency divider circuit according to an embodiment.
Figure 4:
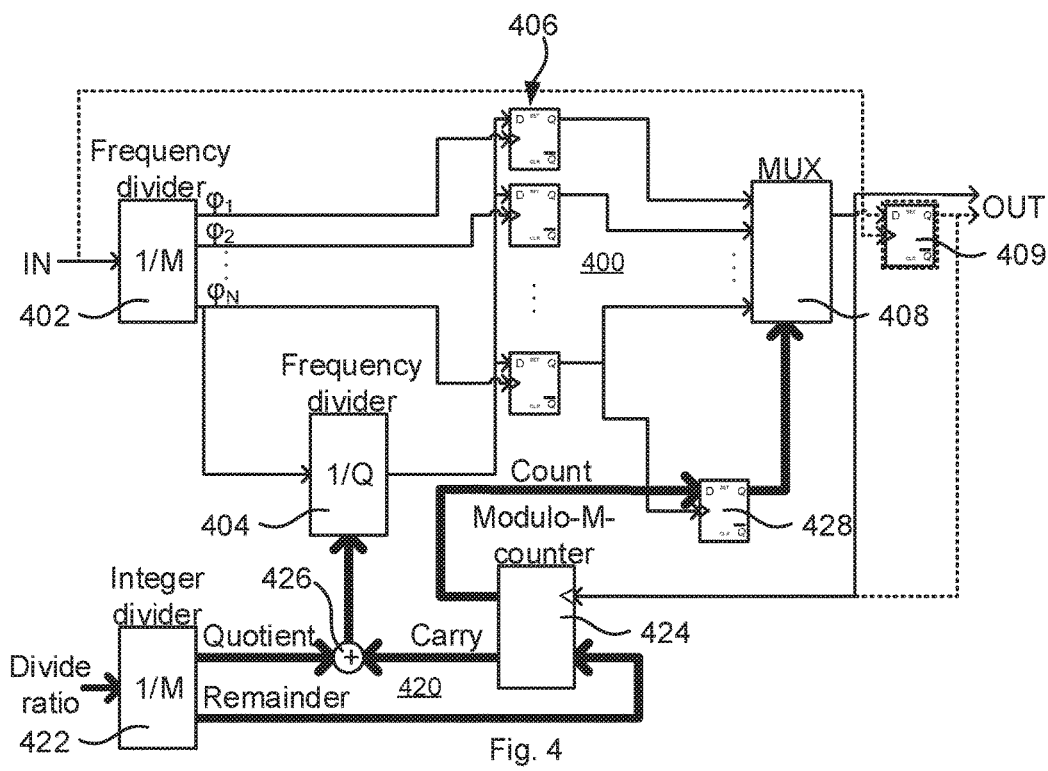
FIG. 4 schematically illustrates a frequency divider circuit according to an embodiment.

FIG. 2 schematically illustrates a PLL 200. The PLL receives the reference signal from a reference oscillator 202. The PLL 200 comprises a phase detector 204, a filter 206, a controlled oscillator 208 and a frequency divider. The phase detector 204 compares phases of the reference signal and a frequency divided replica of the output of the controlled oscillator 208. The phase detector 204 thus outputs a signal indicative of phase difference therebetween. The output signal of the phase detector 204 is filtered by the filter 206 to provide a proper control signal for the controlled oscillator 208, which in turn outputs an oscillating signal based on that control signal. The controlled oscillator 208 may be a voltage controlled oscillator, wherein the control signal is defined by a voltage. Other types of controlled oscillators may also be used, e.g. digitally controlled oscillators, wherein the control signal is a digital value. The oscillating signal output by the controlled oscillator 208 is the output of the PLL 200, and by feeding back the output signal via the frequency divider 210, the PLL will strive towards a locked state where the fed back and frequency divided signal becomes equal to the reference signal, which implies that the relation between the output signal of the PLL 200 and the reference signal will be defined by the frequency divider 210. That is, the fed back frequency divided signal and the reference signal become equal, on average, in phase and frequency by the phase detector 204 providing the signal indicating the phase difference, which signal then affects, via the structure demonstrated above, the controlled oscillator 208. Thus, the expression "equal" is here not to be construed that the above mentioned signals at all times are precisely the same, but is to be construed that the fed back frequency divided signal is regulated, with the constraints of a practical implementation, to be as close as possible, in phase and frequency, to the reference signal. By controlling the frequency divider 210 by a divide ratio, desired properties of the output of the PLL 200 can be achieved. Roughly said, by enabling any value of the divide ratio, any properties of the output signal of the PLL 200 can be achieved. The embodiments of frequency dividers demonstrated below with reference to FIGS. 3 and 4 provides for enabling a variety of divide ratios that traditionally has been hard to achieve.

For operating a radio circuit of the type indicated above, generation of local oscillator signals with phase control is desired. The topic has been discussed in e.g., "A PLL based 12 GHz LO generator with digital phase control in 90 nm CMOS", by A. Axholt and H. Sjöland in Analog Integrated Circuits and Signal Processing, Vol. 67, No. 3, pp. 309-318, 2011 and "A 60 GHz receiver front-end with PLL based phase controlled LO generation for phased-arrays", by A. Axholt and H. Sjöland in Analog Integrated Circuits and Signal Processing, Vol. 80, No. 1, pp. 23-32, 2014. For beamforming, each antenna element is connected to a transceiver, and each transceiver receives local oscillator (LO) signals from a phase-controlled phase locked loop (PLL). All PLLs receive a common lower frequency reference signal, e.g. in the low gigahertz range. In this way it is enough to distribute the reference signal across a radio chip, which can be done at much lower power than distributing the LO signal directly. The PLLs will then locally multiply the reference to a higher frequency and generate quadrature LO signals. By using a common reference signal, the output signals of the PLLs will be fixed in frequency and phase. Digitally controlled current sources may be used to inject current into the loop filter of the PLL, which will produce a very accurately controlled and linear phase shift of the output signal.

To make the frequency programmable with high resolution, and still be able to use a high crystal reference frequency which is desired for low noise, so called fractional-N frequency synthesis is applied. In a fractional-N frequency synthesizer the effective frequency division in the feedback path is a non-integer number. This is accomplished by having a varying modulus of the divider, i.e. it alternates dividing by different numbers. This is performed in such a way that the average division number equals the target value. Analyzing the frequency contents of the series of division numbers, the average will produce a direct current (DC) value that is correct, accompanied by quantization noise. Depending on how the variation is done the quantization noise will take different spectral shapes. In a classical circuit the divider is modulated periodically, creating strong tones called fractional spurs. In present circuits it is popular to use delta-sigma modulators instead, that instead of spurs produce a high-pass shaped noise. Having a high-pass shaped noise is beneficial, since the PLL has a low-pass characteristic that then suppresses it. However, some design constraints on loop bandwidth and filter characteristic must be met for the quantization noise to be suppressed to a level below other noise sources. For each antenna element transceiver, a very fast frequency divider with programmable modulus is then needed.

By using a fixed division number divider for the highest frequencies, which for example may divide by two or four by a prescaler, implies that a circuitry of less complexity. Dividing by two or four is also beneficial, as it can produce a quadrature signal needed by the transceiver. It is beneficial to keep this first frequency division circuitry as simple as possible by using a fixed division number. However, a problem implied by this is frequency resolution. If the succeeding dividers can only divide by integer numbers, the resolution becomes M input clock cycles, where M is division number of the prescaler, which is equal to two or four in the example above. Through the use of quadrature dividers and switching between the output phases, where the phase difference between subsequent phases equals a voltage controlled oscillator (VCO) cycle, the full resolution may be restored, as for example is discussed in "Sub-Integer Frequency Synthesis Using Phase-Rotating Frequency Dividers" by Brian A. Floyd in IEEE TRANSACTIONS ON CIRCUITS AND SYSTEMS I: REGULAR PAPERS, VOL. 55, NO. 7, AUGUST 2008.

One way for phase rotating multi-modulus dividers is to shift between the phases directly at the multi-phase divider output. Using only four phases, the relative phase shift is as large as 90 degrees, which means little overlap between pulses from different phases. This makes the switching at multi-GHz troublesome. If the switching is not done in the correct moment, i.e. when pulses from consecutive phases are overlapping each other, the output is prone to contain glitches, possibly resulting in miscounts in following divider stages. One way to relieve the phase rotating operation is to divide further and create even more phases, as for example is discussed in "A 2.4-GHz Monolithic Fractional-N Frequency Synthesizer With Robust Phase-Switching Prescaler and Loop Capacitance Multiplier" by Keliu Shu, et al. in IEEE JOURNAL OF SOLID-STATE CIRCUITS, VOL. 38, NO. 6, JUNE 2003. The phase difference becomes smaller, e.g. in Keliu et al. 45 degrees, and the phase shifting between consecutive phases is less sensitive to time accuracy. Disadvantages of the solution are that the divider tree grows, causing excessive power consumption, and that the parallel dividers may start up in two different states, with different phase order. The actual state thus needs to be detected and corrected for.

Even if the phase difference is made smaller it is not likely that it is possible to switch between other than nearby phases. Of natural reasons, it would be difficult to switch between phase 0 and phase 4 in a phase rotator with 8 equally spaced phases covering a full period. A common way of achieving consecutive divide ratios using (N+1)/N prescalers is to apply a so called swallow counter. The phase rotator divider is followed by two counters where an S counter, i.e. the swallow counter, counts the number with rotation and a P counter counts the full number of cycles with- and without rotation. Using a phase rotator with 8 phases, the output is either divide by 8 or divide by 9. A problem with this approach is that there is a minimum total divide ratio achievable for full divide ratio coverage. This may sound mysterious but is clarified by the following example: First, counting 3 output pulses with rotation and then 2 without, the total output is 8•3+9•2=42. Altering to 8•2+9•3=43 yields the consecutive divide ratio and so on up to 8•0+9•5=45. With P=6, the minimum divide ratio is 8•6+9•0=48 I.e. with an 8/9 divider, 46-47 are not valid divide ratios. This imposes a requirement on highest possible reference frequency. Consider for example a reference frequency of ~500 MHz, which would be troublesome with a VCO frequency of 20 GHz as 7 or more consecutive divide ratios are common for use in a Delta-Sigma fractional-N PLL.

FIG. 3 schematically illustrates a frequency divider circuit 300 acting as phase rotator which uses another way of multiplexing the signals. A first configurable frequency divider 302 operating at 1/M, e.g. ¼, of the input frequency takes care of the coarse division and the re-clocking done by N phases $\Phi_1, \varphi_2, \ldots, \varphi_N$ gives the fine resolution. For example, N may be four, as is used in the example demonstrated below, but may for example be $2^P$, where P is an integer, or N may be any other integer suitable for the implementation.

In the following example, M is chosen to be 4 and N is chosen to be 4. The benefit of this approach is that the phase differences between the output pulses after the initial divide-by-4 (0°, 90°, 180°, 270°) are divided by a division-value Q in a second frequency divider 304. I.e. the relative phase difference between the phases going into the multiplexer decreases to 0°, (90/Q)°, (180/Q)°, (270/Q)°. Hence, with e.g Q>4 it is possible to do phase shifts between non-consecutive phases. This enables the use of only one configurable divider and a multiplexer 308.

The N formed versions of the frequency divided signal with different phases are used for clocking latch circuits 306, respectively. This enables providing an input signal to the latch circuits 306 with a corresponding phase shift. As input to the latch circuits 306 an output from a second frequency divider 304 is used. The second frequency divider 304 is configurable and provides a frequency division by Q, where Q is determined by a first control signal. The outputs of the latch circuits 306 are provided to the multiplexer, where the output of the frequency divider circuit 300 is selected based on a second control signal.

The signal provided from the multiplexer 308 may then be re-clocked again with the input signal, e.g. by a latch circuit 309, which clocking will improve jitter performance of the frequency divider circuit output.

Digital control of the division number is applied at input of the second divider 304 and at control input of the multiplexer 308. The control may be provided by a control circuit 320. The control may involve using a state machine which is keeping track of the currently selected phase and dependent of which is the succeeding divide ratio, selecting the next Q-value, output phase and switching moment. Although the frequency is relatively low and the phases are overlapping, a glitch-free phase switching may be secured. An example of a scenario with a fixed divide ratio, 41, would require the pattern for (Q, MUX): (10,1), (10,2), (10,3), (11,0), (10,1), (10,2), (10,3), (11,0), . . .

FIG. 4 schematically illustrates a frequency divider circuit 400 acting as phase rotator, which similar to the one demonstrated with reference to FIG. 3 comprises a first frequency divider 402, a second frequency divider 404, N latch circuits 406, and a multiplexer 408, and optionally also an output signal latch circuit 409. The control logic generating the control for the first frequency divider 402 and a multiplexer 408 may be implemented as schematically illustrated in FIG. 4. Depending on the second frequency divider implementation, additional circuitry to control the switching moment for the two control signals may be needed. Following the example above using a divide ratio above it is clear that the control logic could generate the sequence. A delay element 428 for the multiplexer control signal may be provided because the second frequency divider 404 normally needs its divide ratio before the start of a new output cycle. The delay element 428 may be a latch clocked by one of the phase shifted signals provided to the multiplexer 408. Preferably, the one of the phase shifted signals with largest phase shift is selected for the clocking for providing a glitch-free operation.

Figure 8:
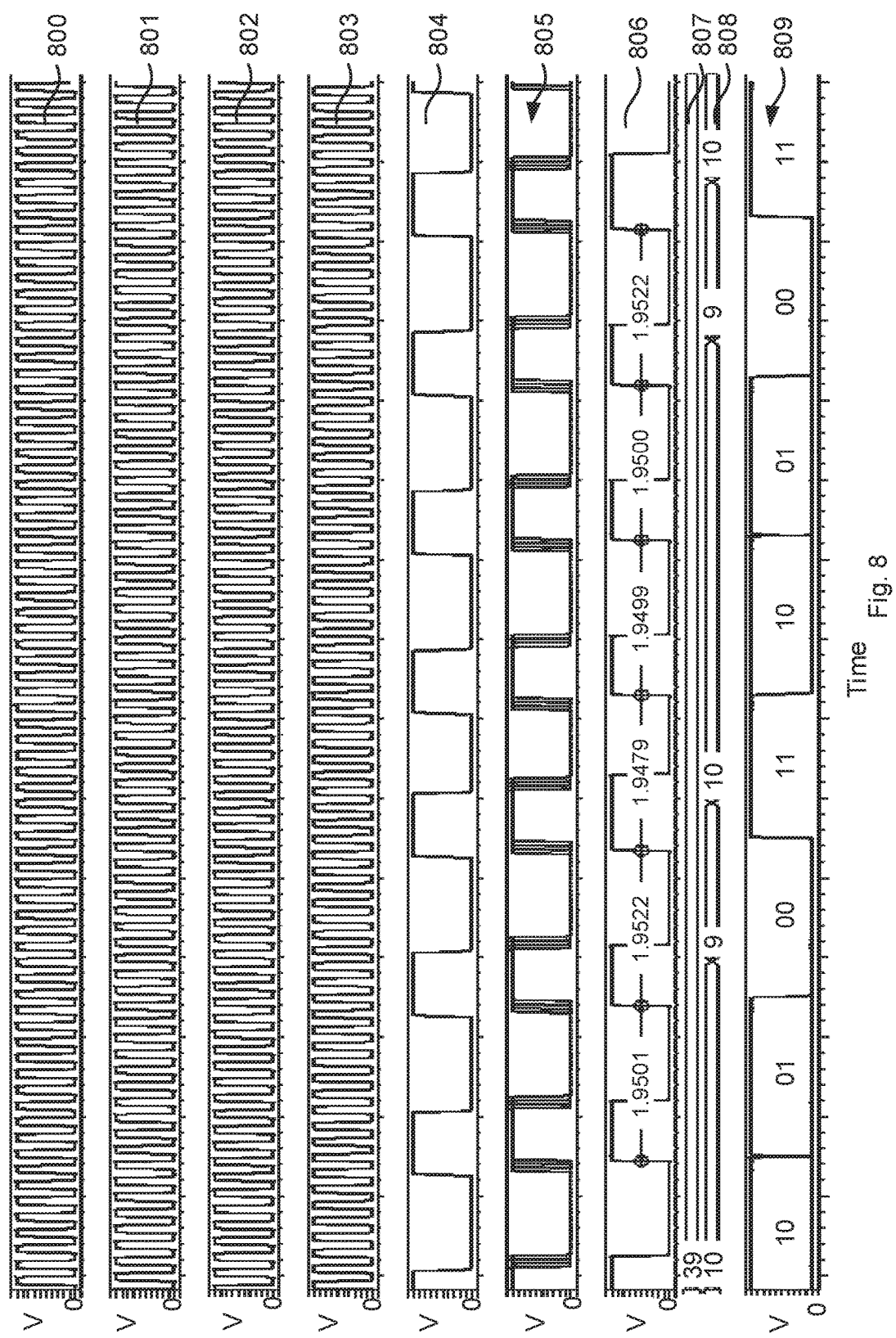
FIG. 8 is a signal diagram.
Figure 9:
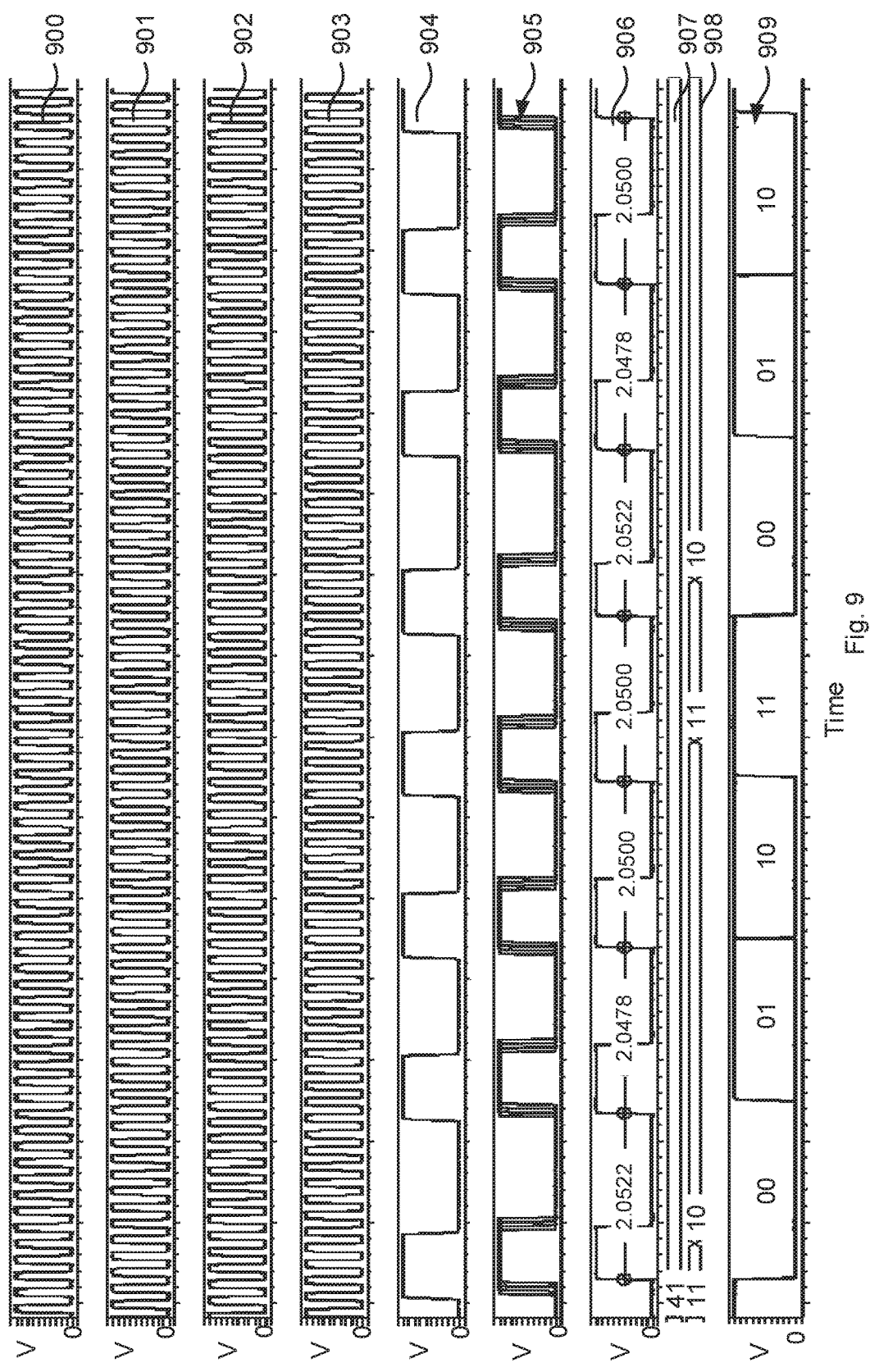
FIG. 9 is a signal diagram.

The divide ratio, e.g. 41 as of the example mentioned above, to be applied is provided to an integer divider 422 which provides a quotient value and a remainder value based on the division factor M applied by the frequency divider 402. The remainder value is provided to a modulo-M-counter 424 which is clocked by the output signal of the frequency divider circuit 400. The modulo-M-counter provides a count value and a carry value. The carry value is provided to an adder 426 which adds the carry value to the quotient value to provide a control signal for the second frequency divider, which thus is controlled to perform frequency division based on the control signal, i.e. divide frequency by the added value. The modulo-M-counter provides the count value to the delay element 428 which outputs count values, based on timing when all inputs to the multiplexer 408 are settled, as a control signal for the multiplexer 408 which selects the one of the phase-shifted signals to output accordingly. This state machine mechanism comprising the integer divider 422, the modulo-M-counter, the adder 426 and the delay element 428 thus makes the frequency divider circuit 400 provide frequency division according to the desired divide ratio as discussed above. FIGS. 8 and 9 are diagrams illustrating examples for divide ratios 39 and 41, respectively, where the mechanism may be employed. These divide ratios are selected examples to be illustrated since they are examples on divide ratios which are normally hard to achieve.

The embodiment demonstrated with reference to FIG. 4 illustrates a state machine mechanism based on a few standard operation elements interacting in a cunning way to implement the control circuit. This provides for reliable and low-power operation also at very high frequencies. The control circuit may also be implemented in other ways, e.g. a mixed hardware-software solution providing the sequence of controls to the second frequency divider and the multiplexer. Such a solution may for example use look-up tables for providing the sequence for different divide ratios.

Figure 5:
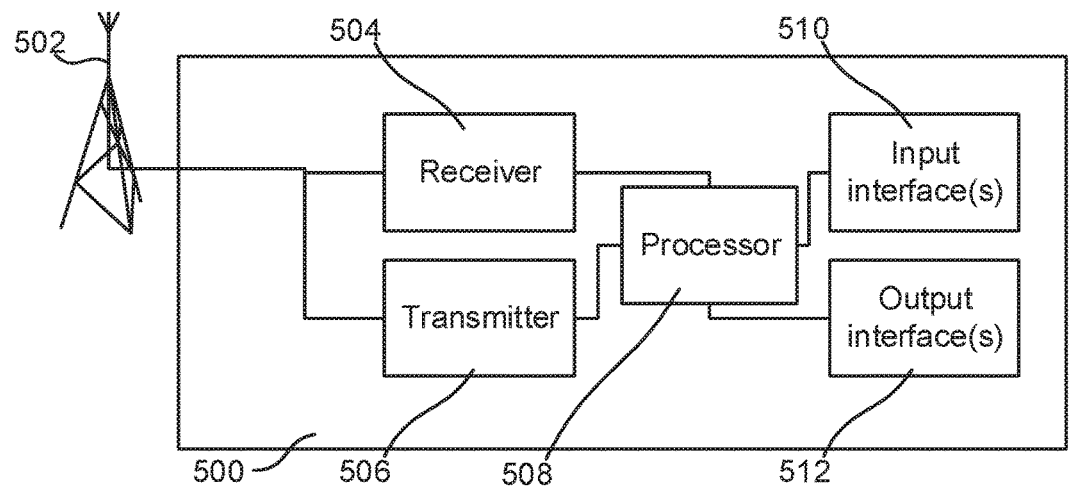
FIG. 5 schematically illustrates such a network node according to an embodiment.

Returning to FIG. 1, the receiver/transmitter/transceiver may employ one or more PLLs including a frequency divider as demonstrated above, and be used in a network node of a wireless communication network, e.g. network node such as a base station of a cellular network or an access point of a short-range communication network, etc. FIG. 5 schematically illustrates such a network node 500 according to an embodiment. The network node 500, which becomes a part of an access network of the system in which it operates, comprises an antenna arrangement 502 comprising one or more antennas, one or more receivers 504 and one or more transmitters 506. The network node 500 may also comprise a processor 508 arranged to control the receiver 504 and/or the transmitter 506. The network node 500 may also comprise one or more input interfaces 510 and/or output interfaces 512. Here, the interfaces 510, 512 may comprise signalling interfaces, operator interfaces, etc.

Figure 6:
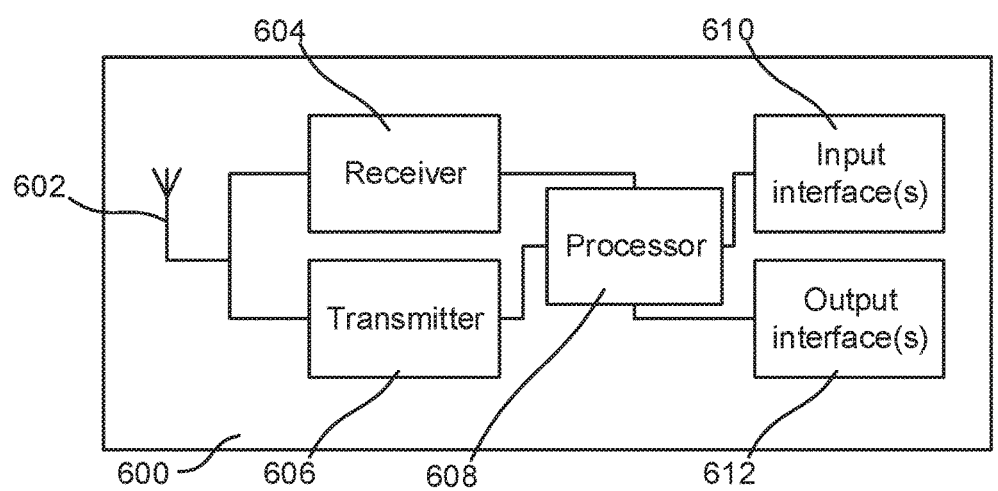
FIG. 6 schematically illustrates such a terminal device of a wireless communication network according to an embodiment.

Returning again to FIG. 1, the receiver/transmitter/transceiver may employ one or more PLLs including a frequency divider as demonstrated above, and be used in a terminal device of a wireless communication network, e.g. a phone, modem, communication card, etc., which may be arranged to operate in a cellular network and/or a short-range communication network, etc. FIG. 6 schematically illustrates such a terminal 600 according to an embodiment. The terminal 600 comprises an antenna arrangement 602 comprising one or more antennas, one or more receivers 604 and one or more transmitters 606. The terminal 600 may also comprise a processor 608 arranged to control the receiver 604 and/or the transmitter 606. The terminal 600 may also comprise one or more input interfaces 610 and/or output interfaces 612. Here, the interfaces 510, 512 may comprise signalling interfaces, user interfaces, etc.

Figure 7:
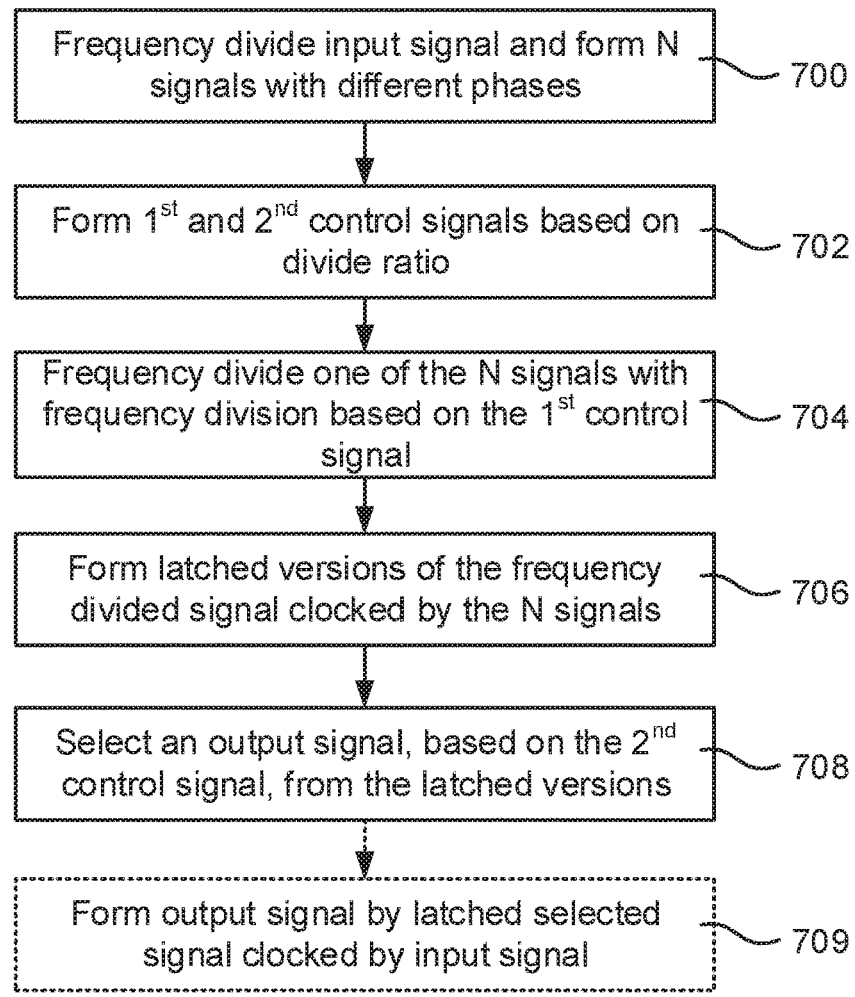
FIG. 7 is a flow chart illustrating a method of frequency dividing according to an embodiment.

FIG. 7 is a flow chart illustrating a method of frequency dividing according to an embodiment. Input signal is frequency divided 700 with a factor M such that N signals of different phases are formed. Based on a desired divide ratio a first control signal and a second control signal are formed 702. The control signals may for example be formed by a state machine mechanism, as demonstrated above. One of the N signals is used to be frequency divided with a frequency division factor Q based on the first control signal. Latched signals are formed 706 by clocking latches with the N signals, respectively, where the latched signals are based on the signal frequency divided by the factor Q. Among these latched signals, one is selected 708 based on the second control signal for forming an output signal of the frequency division. Optionally, the output signal may be latched 709, wherein the clocking may be performed by the input signal of the frequency divider.

Here, the control signals is provided as control sequences based on the divide ratio for the frequency division. The control sequences may be pre-calculated and accessed from a memory, e.g. a shift register. Alternatively, the control sequences are provided by a state machine. The state machine may be implemented by integer division of the divide ratio by M, and the integer division provides a remainder value to be modulo-M-counted, wherein the second control signal is based on the count value, i.e. the value of the second control signal is the count value and it is provided when all the latched signals have been formed 706.

A carry value of the modulo-M-count is added to a quotient value of the integer division to form the value Q of the first control signal.

FIG. 8 is a signal diagram illustrating some of the signals discussed above. Signals 800-803 illustrate the N formed signals, here 4, with different phases provided by the first frequency divider 302, 402. Signal 804 illustrates the output from the second frequency divider 304, 404. Signals 805 illustrate the versions of signals provided by the respective latch circuit 306, 406, i.e. available at inputs of the multiplexer 308, 408 and thus for selection. Signal 806 illustrates the selected output signal of the frequency divider circuit 300, 400. Signal 807 illustrates a control signal provided to the frequency divider circuit giving the divide ratio to be applied. In the example illustrated by FIG. 8 it is 39. Signal 808 illustrates the first control signal provided to the second frequency divider 304, 404, which here is indicated to toggle between 9 and 10, and the consequence can be seen in the variation of cycle of signals 804 and 805. Signals 809 illustrate the second control signal provided to the multiplexer 308, 408 for the selection of output signal 806.

FIG. 9 is a signal diagram similar to FIG. 8 illustrating some of the signals discussed above, but for another divide ratio, i.e. 41. Signals 900-903 illustrate the N formed signals, here 4, with different phases provided by the first frequency divider 302, 402. Signal 904 illustrates the output from the second frequency divider 304, 404. Signals 905 illustrate the versions of signals provided by the respective latch circuit 306, 406, i.e. available at inputs of the multiplexer 308, 408 and thus for selection. Signal 906 illustrates the selected output signal of the frequency divider circuit 300, 400. Signal 907 illustrates a control signal provided to the frequency divider circuit giving the divide ratio to be applied. In the example illustrated by FIG. 9 it is 41. Signal 908 illustrates the first control signal provided to the second frequency divider 304, 404, which here is indicated to toggle between 10 and 11, and the consequence can be seen in the variation of cycle of signals 904 and 905. Signals 909 illustrate the second control signal provided to the multiplexer 308, 408 for the selection of output signal 906.

Figure 10:
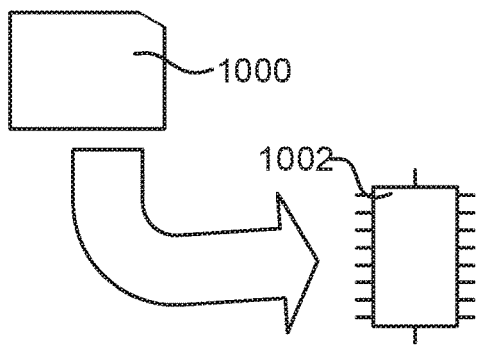
FIG. 10 schematically illustrates a computer-readable medium and a processor arranged to execute program code stored on the computer-readable medium.

The methods according to the present invention may for some embodiments be suitable for implementation with aid of processing means, such as computers and/or processors, especially for the case where the sequence for the first control signal and the second control signal is provided by a hardware-software solution as discussed above. Therefore, there is provided computer programs, comprising instructions arranged to cause the processing means, processor, or computer to perform the steps of any of the methods according to any of the embodiments described with reference to FIG. 7. The computer programs preferably comprises program code which is stored on a computer readable medium 1000, as illustrated in FIG. 10, which can be loaded and executed by a processing means, processor, or computer 1002 to cause it to perform the methods, respectively, according to embodiments of the present invention, preferably as any of the embodiments described with reference to FIG. 7. The computer 1002 and computer program product 1000 can be arranged to execute the program code sequentially where actions of the any of the methods are performed stepwise. The processing means, processor, or computer 1002 is preferably what normally is referred to as an embedded system. Thus, the depicted computer readable medium 1000 and computer 1002 in FIG. 10 should be construed to be for illustrative purposes only to provide understanding of the principle, and not to be construed as any direct illustration of the elements.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. An electronic frequency-divider circuit comprising:
   a multi-phase generator circuit configured to:
      receive an oscillating input signal having a frequency f;
      determine an integer divide ratio Q based on a first control signal input; and
      based on the oscillating input signal, generate an N-phase output signal having a frequency f-divided-by-M, wherein M is an integer and adjacent phases of the N-phase output signal are separated by 360-divided-by-(M-times-Q) degrees;
   a control circuit configured to receive a control input and, based on the control input:
      provide the first control signal to the multi-phase generator circuit; and
      select a particular phase of the N-phase output signal.

2. The electronic frequency-divider circuit of claim 1, wherein the multi-phase generator circuit comprises a first frequency divider arranged to receive the oscillating input signal and generate a first N-phase signal having a frequency f-divided-by-M, wherein adjacent phases of the first N-phase signal are separated by 360-divided-by-M degrees.

3. The electronic frequency-divider circuit of claim 2, wherein the multi-phase generator circuit further comprises:
   a second frequency divider arranged to, based on the divide ratio Q, generate a second oscillating signal having a frequency f-divided-by-(M-times-Q); and
   a latch circuit arranged to generate the N-phase output signal based on the second oscillating signal and the first N-phase signal.

4. The electronic frequency-divider circuit of claim 1, wherein:
   the control circuit is further arranged to generate a second control signal; and
   the electronic frequency-divider circuit further comprises a multiplexer circuit configured to:
      receive the N-phase output signal; and
      generate an output signal, comprising the particular phase of the N-phase output signal, based on the second control signal.

5. The electronic frequency-divider circuit of claim 4, wherein:
   the control input comprises a programmable divide ratio; and
   the control circuit is further arranged to generate the first control signal and the second control signal based on the programmable divide ratio.

6. The electronic frequency-divider circuit of claim 5, wherein the control circuit comprises a state machine arranged to provide the first control signal and the second control signal, for each particular cycle of the output signal, based on the programmable divide ratio and the output signal provided by the multiplexer circuit during a cycle of the output signal that precedes the particular cycle.

7. The electronic frequency-divider circuit of claim 4, further comprising an output latch circuit arranged to generate a further output signal based on the oscillating input signal received at a clocking input and the output signal from the multiplexer circuit received at a data input.

8. The electronic frequency-divider circuit of claim 4, wherein:

the control input comprises a programmable divide ratio; and the control circuit comprises:

an integer divider circuit arranged to generate an integer quotient value and an integer remainder value based on dividing the programmable divide ratio by M;

a modulo-M-counter arranged to:

receive the remainder value as an input and the output signal as a clocking input; and output a count value and a carry value; and an adder circuit arranged to generate the first control signal by adding the integer quotient value and the carry value.

9. The electronic frequency-divider circuit of claim 8, wherein control circuit is further configured to generate the second control signal based on the count value.

10. The electronic frequency-divider circuit of claim 3, wherein the second frequency divider is further arranged to generate the second oscillating signal based on a particular phase of the first N-phase signal.

11. The electronic frequency-divider circuit of claim 1, wherein M equals N.

12. A phase-locked loop circuit comprising the electronic frequency-divider circuit of claim 1.

13. A transceiver circuit comprising the phase-locked loop circuit of claim 12.

14. A radio station comprising:

the transceiver circuit of claim 13; and an antenna arrangement connected to the transceiver circuit.

15. A method of frequency-dividing an oscillating input signal, the method comprising:

receiving an oscillating input signal having a frequency f;

determining an integer divide ratio Q based on a control input;

based on the oscillating input signal, generating an N-phase output signal having a frequency f-divided-by-M, wherein M is an integer and adjacent phases of the N-phase output signal are separated by 360-divided-by-(M-times-Q) degrees; and selecting a particular phase of the N-phase output signal.

16. The method of claim 15, wherein generating the N-phase output signal comprises generating a first N-phase signal having a frequency f-divided-by-M, wherein adjacent phases of the first N-phase signal are separated by 360-divided-by-M degrees.

17. The method of claim 15, wherein generating the N-phase output signal further comprises:

generating a second oscillating signal having a frequency f-divided-by-(M-times-Q); and generating the N-phase output signal based on the second oscillating signal and the first N-phase signal.

18. The method of claim 15, wherein:

the control input comprises a programmable divide ratio; and the method further comprises generating a first control signal and a second control signal based on the programmable divide ratio.

19. The method of claim 18, wherein selecting a particular phase of the N-phase output signal is based on the second control signal.

20. The method of claim 18, wherein determining the integer divide ratio Q is based on the first control signal.

* * * * *